(12) United States Patent
Zuo et al.

(10) Patent No.: US 10,141,922 B2
(45) Date of Patent: Nov. 27, 2018

(54) COMPARATOR AND LOW POWER CONSUMPTION OSCILLATOR THEREOF

(71) Applicants: SHENZHEN SKYWORTH-RGB ELECTRONIC CO., LTD., Shenzhen (CN); SHENZHEN SKYWORTH SEMICONDUCTOR DESIGN CENTER CO., LTD., Shenzhen (CN)

(72) Inventors: Shijun Zuo, Shenzhen (CN); Zhichang Yang, Shenzhen (CN); Xiaojun Yang, Shenzhen (CN)

(73) Assignees: SHENZHEN SKYWORTH-RGB ELECTRONIC CO., LTD., Shenzhen (CN); SHENZHEN SKYWORTH SEMICONDUCTOR DESIGN CENTER CO., LTD., Shenzhen (CN)

( * ) Notice: Subject to any disclaimer, the term of this patent is extended or adjusted under 35 U.S.C. 154(b) by 53 days.

(21) Appl. No.: 15/507,573

(22) PCT Filed: Feb. 23, 2016

(86) PCT No.: PCT/CN2016/074303
§ 371 (c)(1),
(2) Date: Feb. 28, 2017

(87) PCT Pub. No.: WO2017/107301
PCT Pub. Date: Jun. 29, 2017

(65) Prior Publication Data
US 2018/0062635 A1    Mar. 1, 2018

(30) Foreign Application Priority Data

Dec. 24, 2015    (CN) .......................... 2015 1 0983734

(51) Int. Cl.
*H03K 17/14*    (2006.01)
*G05F 3/16*    (2006.01)
(Continued)

(52) U.S. Cl.
CPC ............... *H03K 17/14* (2013.01); *G05F 3/16* (2013.01); *H03K 3/012* (2013.01); *H03K 3/023* (2013.01);
(Continued)

(58) Field of Classification Search
CPC ......... G05F 3/00; G05F 3/16; G11C 2207/00; G11C 2207/063; G11C 7/00; G11C 7/062;
(Continued)

(56) References Cited

U.S. PATENT DOCUMENTS 7,586,336 B2    9/2009  Blum
2007/0297812 A1*  12/2007  Takeuchi ............. H03K 3/0377
    398/202

(Continued)

FOREIGN PATENT DOCUMENTS

CN    101093983 A    12/2007
CN    101548466 A    9/2009
(Continued)

OTHER PUBLICATIONS

The World Intellectual Property Organization (WIPO) International Search Report for PCT/CN2016/074303 dated Oct. 10, 2016 4 Pages.

*Primary Examiner* — Lincoln Donovan
*Assistant Examiner* — David Mattison
(74) *Attorney, Agent, or Firm* — Anova Law Group, PLLC (57) ABSTRACT

A comparator includes a current mirror module, a comparison module and a buffering and outputting module. The current mirror module provides a bias current to the comparison module. The comparison module comprises a positive input end, a first negative input end and a second negative input end, the positive input end connects to an (Continued)

external terminal, the first negative input end and the second negative input end input a low threshold voltage and a high threshold voltage, respectively. The comparison module compares a voltage of the positive input end to the low threshold voltage and the high threshold voltage, and outputs a comparison result to the buffering and outputting module.

5 Claims, 4 Drawing Sheets

(51) Int. Cl.
 *H03K 3/012* (2006.01)
 *H03K 3/023* (2006.01)
 *H03K 3/0231* (2006.01)
 *H03K 5/08* (2006.01)
 *H03K 5/24* (2006.01)

(52) U.S. Cl.
 CPC ........... *H03K 3/0231* (2013.01); *H03K 5/088* (2013.01); *H03K 5/2481* (2013.01)

(58) Field of Classification Search
 CPC ........ G11C 7/067; H03K 17/00; H03K 17/14; H03K 3/00; H03K 3/012; H03K 3/023; H03K 5/00; H03K 5/088; H03K 5/2481
 USPC .......................................................... 327/53
 See application file for complete search history.

(56) References Cited

U.S. PATENT DOCUMENTS

| | | | | |
|---|---|---|---|---|
| 2009/0072873 | A1* | 3/2009 | Denier | H03K 5/003 327/175 |
| 2009/0224804 | A1* | 9/2009 | Noda | G01K 3/005 327/53 |
| 2011/0115529 | A1* | 5/2011 | Jansson | H03K 5/2481 327/90 |

FOREIGN PATENT DOCUMENTS

| | | |
|---|---|---|
| CN | 101667048 A | 3/2010 |
| CN | 101847981 A | 9/2010 |
| CN | 103888137 A | 6/2014 |
| JP | 2001345682 A | 12/2001 |

* cited by examiner

COMPARATOR AND LOW POWER CONSUMPTION OSCILLATOR THEREOF

CROSS-REFERENCES TO RELATED APPLICATIONS

This application is a national stage application of PCT Patent Application No. PCT/CN2016/074303, filed on Feb. 23, 2016, which claims priority to Chinese Patent Application No. 201510983734.0, filed on Dec. 24, 2015, the content of all of which is incorporated herein by reference.

FIELD OF THE INVENTION

The present invention relates to the field of oscillator technology, and, more particularly, to a comparator and low power consumption oscillator thereof.

BACKGROUND

In an electronic system, a circuit of oscillator is a necessary module. Following a cost pressure keeping increasing, an area of a chip requires to be kept reducing as wanted, in a premise of ensuring a function, a simpler circuit structure needs to be designed, being able to reducing an area of the module, and lowering a consumption of power.

A conventional oscillator generally comprises two comparators, a capacitor, and a set of bias circuit, applied to charging and discharging the capacitor, inputting a high threshold and a low threshold to the two comparators respectively, when a voltage of the capacitor is greater than the high threshold, one comparator inverses, and controls the bias circuit discharge, to lower the voltage of the capacitor, when the voltage of the capacitor is less than the low threshold, another comparator inverses, and controls the bias circuit charge, to raise the voltage of the capacitor, it is repeating in such a way, and outputting an oscillation signal. Such an oscillator owns a simple structure and principle, however, a function of the comparator in the oscillator is simple, and the oscillator owns a complex structure and a relatively high consumption of power.

Therefore, the current technology needs to be improved and developed.

BRIEF SUMMARY OF THE DISCLOSURE

According to the above described defects, the purpose of the present invention is providing a comparator and low power consumption oscillator thereof, in order to solve the problems in the prior arts and be able to simplify a circuit structure and lower the power consumption of the circuit.

In order to achieve the above mentioned goals, the technical solution of the present invention to solve the technical problems is as follows:

A comparator, wherein, it comprises a current mirror module, a comparison module and a buffering and outputting module, the current mirror module provides a bias current to the comparison module, the comparison module comprises a positive input end, a first negative input end and a second negative input end, the positive input end connects to an external terminal, the first negative input end and the second negative input end input a low threshold voltage and a high threshold voltage, respectively, the comparison module compares a voltage of the positive input end to the low threshold voltage and the high threshold voltage, and outputs a comparison result to the buffering and outputting module, when the voltage of the positive input end is less than the low threshold voltage, the buffering and outputting module outputs a low voltage to the comparison module; when the voltage of the positive input end is greater than the high threshold voltage, the buffering and outputting module outputs a high voltage to the comparison module;

wherein, the comparison module comprises a first comparison unit, a second comparison unit and an amplifying unit, the first comparison unit comprises the first negative input end, the second comparison unit comprises the positive input end and the second negative input end, the second comparison unit outputs the comparison result to the amplifying unit, which then amplifies the comparison result before outputting to the buffering and outputting module, when the voltage of the positive input end is less than the low threshold voltage of the first negative input end, the buffering and outputting module outputs a low voltage to the first comparison unit, and controls the first comparison unit to shut down; when the voltage of the positive input end is larger than the high threshold voltage of the second negative input end, the buffering and outputting module outputs a high voltage to the first comparison unit, and controls the first comparison unit to start up, the low threshold voltage is less than the high threshold voltage.

The comparator, wherein, the current mirror module comprises a first MOS tube and a second MOS tube; a source electrode of the first MOS tube and a source electrode of the second MOS tube connect to a VCC power supplier end, a gate electrode of the first MOS tube connects to a drain electrode of the first MOS tube, a gate electrode of the second MOS tube and a first bias terminal, a drain electrode of the second MOS tube connects to the comparison module.

The comparator, wherein, the current mirror module comprises a first MOS tube and a second MOS tube; a source electrode of the first MOS tube and a source electrode of the second MOS tube connect to a VCC power supplier end, a gate electrode of the first MOS tube connects to a drain electrode of the first MOS tube, a gate electrode of the second MOS tube and a first bias terminal, a drain electrode of the second MOS tube connects to the comparison module.

The comparator, wherein, the first comparison unit comprises a third MOS tube and a first switch tube, the second comparison unit comprises a fourth MOS tube, a fifth MOS tube, a sixth MOS tube, a seventh MOS tube, the amplifying unit comprises an eighth MOS tube and a ninth MOS tube; a source electrode of the third MOS tube, a source electrode of the fourth MOS tube, and a source electrode of the sixth MOS tube connect to the drain electrode of the second MOS tube, the gate electrode of the third MOS tube is the negative input end of the comparator, the drain electrode of the third MOS tube connects to the drain electrode of the first switch tube, the gate electrode of the first switch tube connects to the buffering and outputting module, the gate electrode of the fourth MOS tube is the second negative input end of the comparator, the drain electrode of the fourth MOS tube connects to the source electrode of the first switch tube, the drain electrode of the fifth MOS tube and the gate electrode of the fifth MOS tube, the gate electrode of the fifth MOS tube connects to the gate electrode of the seventh MOS tube, the gate electrode of the sixth MOS tube is the positive input end of the comparator, the drain electrode of the sixth MOS tube connects to a gate electrode of the ninth MOS tube and a drain electrode of the seventh MOS tube, a gate electrode of the eighth MOS tube connects to the gate electrode of the second MOS tube, a source electrode of the eighth MOS tube connects to the VCC power supplier end, a drain electrode of the eighth MOS tube connects to a drain electrode of the ninth MOS tube and the buffering and outputting module, the source electrode of the fifth MOS tube, the source electrode of the seventh MOS tube and the source electrode of the ninth MOS tube get grounded.

A low power consumption oscillator, comprises a capacitor and a current bias module, wherein, the low power consumption oscillator further comprises a switch module and the above said comparator, the capacitor connects to a positive input end of the comparator, when a voltage of the capacitor is less than a low threshold voltage of the first negative input end of the comparator, the comparator outputs a low voltage to the switch module, which then controls the current bias module to charge the capacitor; when the voltage of the capacitor is greater than a high threshold voltage of the second negative input end of the comparator, the comparator outputs a high voltage to the switch module, which controls the current bias module to discharge the capacitor, the low threshold voltage is less than the high threshold voltage.

The low power consumption oscillator, wherein, the current bias module comprises a first current mirror unit and a second current mirror unit, when the voltage of the capacitor is less than the low threshold voltage, the comparator outputs a low voltage to the switch module, which then controls the first current mirror unit to charge the capacitor; when the voltage of the capacitor is greater than the high threshold voltage, the comparator outputs the high voltage to the switch module, which controls the second current mirror unit to discharge the capacitor.

The low power consumption oscillator, wherein, the switch module comprises a first switch unit and a second switch unit, when the voltage of the capacitor is less than the low threshold voltage, the comparator outputs the low voltage to the switch module, starting up the first switch unit and shutting down the second switch unit, making the first current mirror unit charge the capacitor; when the voltage of the capacitor is greater than the high threshold voltage, the comparator outputs the high voltage to the switch module, shutting down the first switch unit and starting up the second switch unit, making the second current mirror unit discharge the capacitor.

The low power consumption oscillator, wherein, the first switch unit comprises a second switch tube, the second switch unit comprises a third switch tube; a source electrode of the second switch tube connects to the first current mirror unit, the drain electrode of the second switch tube connects to the drain electrode of the third switch tube, further connects to the positive input end of the comparator and one end of the capacitor, the gate electrode of the second switch tube connects to the gate electrode of the third switch tube and the output end of the comparator, the source electrode of the third switch tube connects to the second current mirror unit.

The low power consumption oscillator, wherein, the first current mirror unit comprises a tenth MOS tube, an eleventh MOS tube, a twelfth MOS tube and a thirteenth MOS tube; a source electrode of the tenth MOS tube and a source electrode of the twelfth MOS tube connect to the VCC power supplier end, a gate electrode of the tenth MOS tube connects to a gate electrode of the twelfth MOS tube, a drain electrode of the tenth MOS tube and a source electrode of the eleventh MOS tube, a gate electrode of the eleventh MOS tube connects to a gate electrode of the thirteenth MOS tube, a drain electrode of the eleventh MOS tube and the second current mirror unit, a drain electrode of the twelfth MOS tube connects to a source electrode of the thirteenth MOS tube, a drain electrode of the thirteenth MOS tube connects to a source electrode of the second switch tube.

The low power consumption oscillator, wherein, the second current mirror unit comprises a fourteenth MOS tube, a fifteenth MOS tube, a sixteenth MOS tube, a seventeenth MOS tube; an eighteenth MOS tube and a nineteenth MOS tube; a drain electrode of the fourteenth MOS tube connects to a second bias terminal, and further connects to a gate electrode of the fourteenth MOS tube, the gate electrode of the fourteenth MOS tube further connects to a gate electrode of the sixteenth MOS tube and a gate electrode of the eighteenth MOS tube, a source electrode of the fourteenth MOS tube connects to a drain electrode of the fifteenth MOS tube and a gate electrode of the fifteenth MOS tube, the gate electrode of the fifteenth MOS tube further connects to a gate electrode of the seventeenth MOS tube and a gate electrode of the nineteenth MOS tube, a drain electrode of the sixteenth MOS tube connects to a drain electrode of the eleventh MOS tube, a gate electrode of the eleventh MOS tube and a gate electrode of the thirteenth MOS tube, a source electrode of the sixteenth MOS tube connects to a drain electrode of the seventeenth MOS tube, a drain electrode of the eighteenth MOS tube connects to a source electrode of the third switch tube, a source electrode of the eighteenth MOS tube connects to a drain electrode of the nineteenth MOS tube, a source electrode of the fifteenth MOS tube, a source electrode of the seventeenth MOS tube and a source electrode of the nineteenth MOS tube connect to other end of the capacitor and get grounded.

Comparing to the prior arts, the present invention provides a comparator and low power consumption oscillator thereof, wherein, the comparator comprises a current mirror module, a comparison module and a buffering and outputting module, the low power consumption oscillator comprises a capacitor, a current bias module, a switch module and the comparator, the comparison module comprises a positive input end, a first negative input end and a second negative input end, the capacitor connects to the positive input end of the comparator, when a voltage of the capacitor is less than a low threshold voltage of the first negative input end of the comparator, the comparator outputs a low voltage to the switch module, which controls the current bias module to charge the capacitor; when a voltage of the capacitor is greater than a high threshold voltage of the second negative input end of the comparator, the comparator outputs a high voltage to the switch module, which controls the current bias module to discharge the capacitor, thus, through one comparator, a periodic charging and discharging to the capacitor is achieved, and an oscillation signal is output, thus a number of the comparators is reduced, a structure of the circuit is simplified, a power consumption of the circuit and a cost of a product is reduced.

DETAILED DESCRIPTION OF EMBODIMENTS

According to the defects in the prior art that, an oscillator has a plurality of defects including a complex structure and a relatively high power consumption, the present invention provides a comparator and low power consumption oscillator thereof, which is able to achieve a function of two comparators in a conventional way through one comparator, thus a circuit structure is simplified, a power consumption of a circuit and a cost of a product is reduced.

In order to make the purpose, technical solution and the advantages of the present invention clearer and more explicit, further detailed descriptions of the present invention are stated here, referencing to attached drawings and some preferred embodiments of the present invention. It should be understood that the detailed embodiments of the invention described here are used to explain the present invention only, instead of limiting the present invention.

Figure 1:
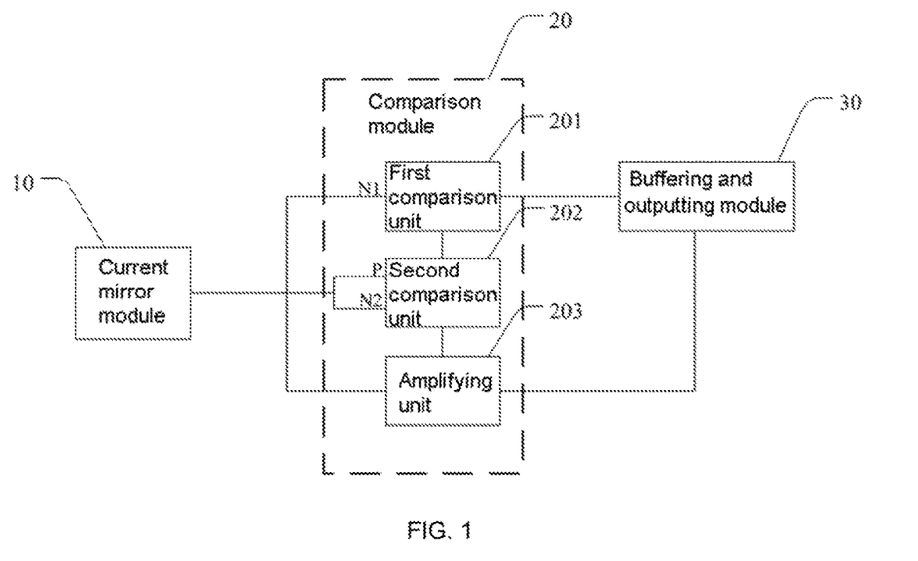
FIG. 1 illustrates a schematic diagram of a comparator provided in the present invention.

Referencing to FIG. 1, the comparator provided in the present invention comprises a current mirror module 10, a comparison module 20 and a buffering and outputting module 30, which are connected in a sequence, specifically, the comparator has a positive input end P, a first negative input end N1 and a second negative input end N2 arranged, the positive input end P connects to an external voltage, the first negative input end N1 and the second negative input end N2 input a low threshold voltage and a high threshold voltage respectively, the current mirror module 10 provides a bias current to the comparison module 20, which compares a voltage of the positive input end P to the low threshold voltage of the first negative input end N1 and the high threshold voltage of the second negative input end N2, and outputs a comparison result to the buffering and outputting module 30, when the voltage of the positive input end P is less than the low threshold voltage of the first negative input end N1, the buffering and outputting module 30 outputs a low voltage to the comparison module 20; when the voltage of the positive input end P is greater than the high threshold voltage of the second negative input end N2, the buffering and outputting module 30 outputs a high voltage to the comparison module 20, thus comparing the voltage of the positive input end to the voltage of the first negative input end N1 and the voltage of the second negative input end N2 at a same time before outputting a comparison result is achieved, which has enriched a function of the comparator and simplified the structure of a circuit.

Specifically, the comparison module 20 comprises a first comparison unit 201, a second comparison unit 202 and an amplifying unit 203, the first comparison unit 201 comprises the first negative input end N1, the second comparison unit 202 comprises the positive input end P and the second negative input end N2, the first comparison unit 201, the second comparison unit 202 and the amplifying unit 203 are all connecting to the current mirror module 10, the buffering and outputting module 30 connects to the first comparison unit 201 and the amplifying unit 203, the second comparison unit 202 outputs the comparison result to the amplifying unit 203, which then amplifies the comparison result before outputting to the buffering and outputting module 30, when the voltage of the positive input end P is less than the low threshold voltage of the first negative input end N1, the buffering and outputting module 30 outputs a low voltage to the first comparison unit 201, and controls the first comparison unit 201 to shut down; when the voltage of the positive input end P is larger than the high threshold voltage of the second negative input end N2, the buffering and outputting module 30 outputs a high voltage to the first comparison unit 201, and controls the first comparison unit 201 to start up, the low threshold voltage is less than the high threshold voltage.

The comparison module 20 has the first comparison unit 201 and the second comparison unit 202 arranged, the first comparison unit 201 connects to the first negative input end N1 of the comparator, the second comparison unit 202 connects to the positive input end P of the comparator the second negative input end N2, when the voltage of the positive input end P is less than the low threshold voltage of the first negative input end N1, the second comparison unit 202 outputs the comparison result to the amplifying unit 203, the buffering and outputting module 30 outputs the low voltage to the first comparison unit 201, and controls the first comparison unit 201 shut down, now the first negative input end N1 does not work, comparing the voltage of the positive input end P with the high threshold voltage of the second negative input end N2, when the voltage of the positive input end P is greater than the high threshold voltage of the second negative input end N2, the buffering and outputting module 30 outputs the high voltage to the first comparison unit 201, and controls the first comparison unit 201 start up, now the first negative input end N1 reconnects to the circuit, when the voltage of the positive input end P is less than the low threshold voltage of the first negative input end N1, the buffering and outputting module 30 outputs the low voltage to the first comparison unit 201, and controls the first comparison unit 201 shut down again, and repeats in such a way, thus, achieves a comparison of the voltage of the positive input end P with the low threshold voltage of the first negative input end N1 and the high threshold voltage of the second negative input end N2 at a same time, using one comparator to substitute two comparators in the conventional way, thus the structure of circuit is simplified.

Figure 2:
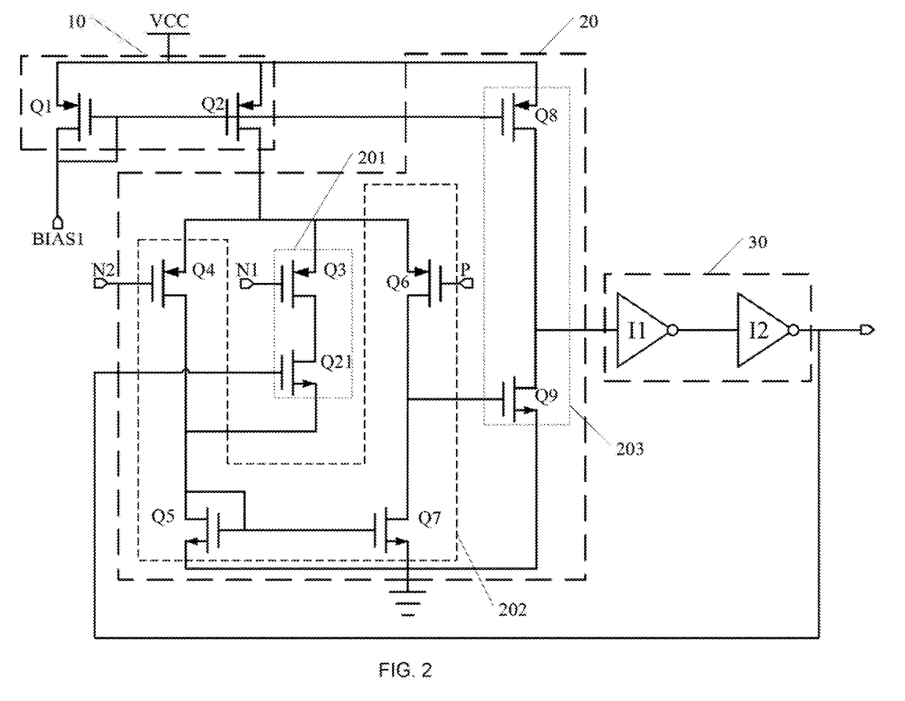
FIG. 2 illustrates a circuit diagram of a comparator provided in the present invention.

Further, referencing to FIG. 2 together, the current mirror module 10 comprises a first MOS tube Q1 and a second MOS tube Q2; a source electrode of the first MOS tube Q1 and a source electrode of the second MOS tube Q2 connect to a VCC power supplier end, a gate electrode of the first MOS tube Q1 connects to a drain electrode of the first MOS tube Q1, a gate electrode of the second MOS tube Q2 and a first bias terminal BIAS1, a drain electrode of the second MOS tube Q2 connects to the comparison module 20, wherein, the first MOS tube Q1 and the second MOS tube Q2 are PMOS tubes, provide the bias current for the comparison module 20.

The first comparison unit 201 comprises a third MOS tube Q3 and a first switch tube Q21, the second comparison unit 202 comprises a fourth MOS tube Q4, a fifth MOS tube Q5, a sixth MOS tube Q6, a seventh MOS tube Q7, the amplifying unit 203 comprises an eighth MOS tube Q8 and a ninth MOS tube Q9; wherein, the first switch tube Q21 is an NMOS tube, which is conducted when the gate electrode is at a high voltage, and cut off when the gate electrode is at a low voltage.

A source electrode of the third MOS tube Q3, a source electrode of the fourth MOS tube Q4, and a source electrode of the sixth MOS tube Q6 connect to the drain electrode of the second MOS tube Q2, the gate electrode of the third MOS tube Q3 is the negative input end N1 of the comparator, the drain electrode of the third MOS tube Q3 connects to the drain electrode of the first switch tube Q21, the gate electrode of the first switch tube Q21 connects to the buffering and outputting module 30, the gate electrode of the fourth MOS tube Q4 is the second negative input end N2 of the comparator, the drain electrode of the fourth MOS tube Q4 connects to the source electrode of the first switch tube Q21, the drain electrode of the fifth MOS tube Q5 and the gate electrode of the fifth MOS tube Q5, the gate electrode of the fifth MOS tube Q5 further connects to the gate electrode of the seventh MOS tube Q7, the gate electrode of the sixth MOS tube Q6 is the positive input end P of the comparator, the drain electrode of the sixth MOS tube Q6 connects to a gate electrode of the ninth MOS tube Q9 and a drain electrode of the seventh MOS tube Q7, a gate electrode of the eighth MOS tube Q8 connects to the gate electrode of the second MOS tube Q2, a source electrode of the eighth MOS tube Q8 connects to the VCC power supplier end, a drain electrode of the eighth MOS tube Q8 connects to a drain electrode of the ninth MOS tube Q9 and the buffering and outputting module 30, the source electrode of the fifth MOS tube Q5, the source electrode of the seventh MOS tube Q7 and the source electrode of the ninth MOS tube Q9 get grounded, wherein, the third MOS tube Q3, the fourth MOS tube Q4, the sixth MOS tube Q6 and the eight MOS tube Q8 are PMOS tubes, the fifth MOS tube Q5, the seventh MOS tube Q7, the ninth MOS tube Q9 are NMOS tubes.

The comparator provided in the present invention provides the bias current through a current mirror composed by the first MOS tube Q2 and the second MOS tube Q2, the fourth MOS tube Q4, the fifth MOS tube Q5, the sixth MOS tube Q6 and the seventh MOS tube Q7 compose a conventional differential circuit, before adding the third MOS tube Q3 and the first switch tube Q21 to the conventional differential circuit, wherein, the third MOS tube Q3, the fourth MOS tube Q4 and the sixth MOS tube Q6 have a same size, thus, comparing to the comparator in the prior art, the comparator provided in the present invention has added a negative input end, and achieved an exact comparison of the voltage of the positive input end with that of the two negative input ends at the same time, additionally, the eighth MOS tube Q8 and the ninth MOS tube Q9 compose a second level of the comparator, which may amplify a gain of the comparison result, and further ensure an accuracy of the comparison result.

Continue referencing to FIG. 2, the buffering and outputting module 30 comprises a first inverter I1 and a second inverter I2, an input end of the first inverter I1 connects to the drain electrode of the eighth MOS tube Q8 and the drain electrode of the ninth MOS tube Q9, an output end of the first inverter I1 connects to an input end of the second inverter I2, an output end of the second inverter I2 connects to the gate electrode of the first switch tube Q21, the first inverter I1 and the second inverter I2 compose a buffer level.

Figure 3:
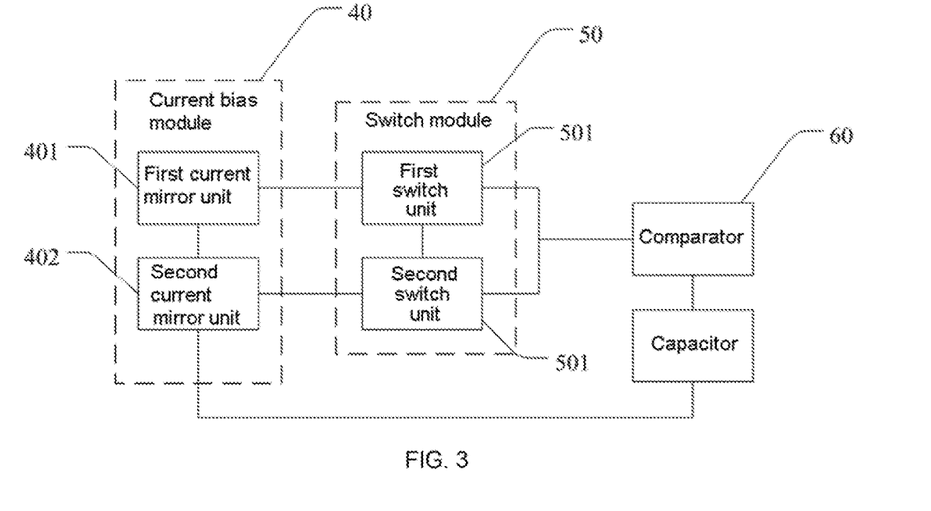
FIG. 3 illustrates a schematic diagram of a low power consumption oscillator provided in the present invention.
Figure 4:
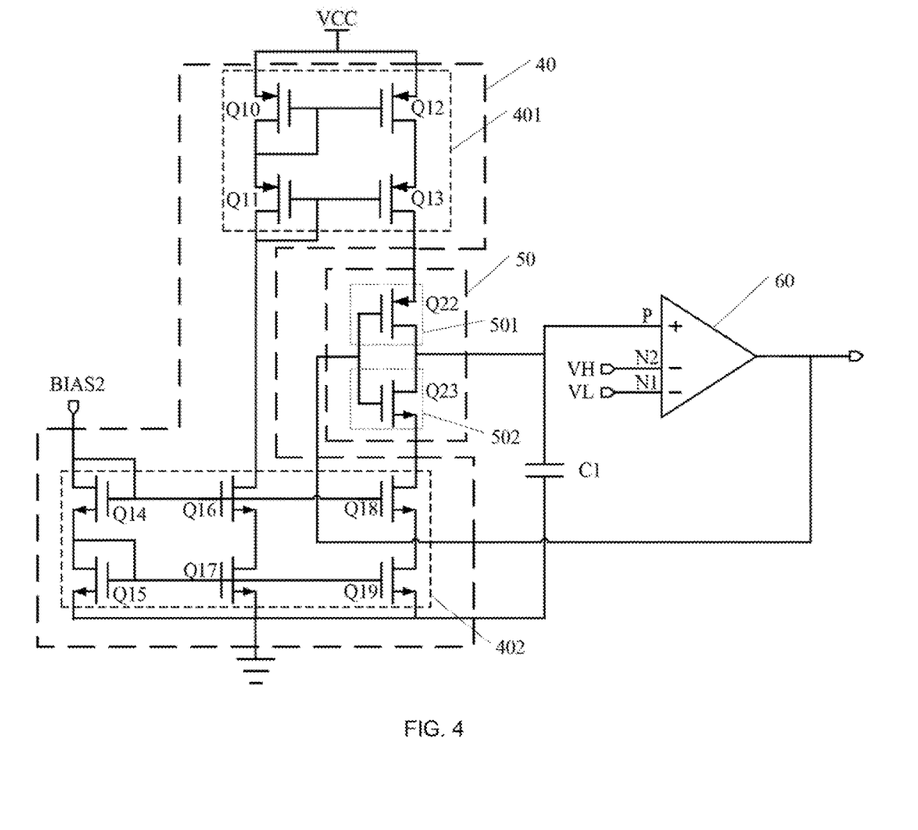
FIG. 4 illustrates a circuit diagram of a low power consumption oscillator provided in the present invention.

The present invention further provides a low power consumption oscillator, as shown in FIG. 3 and FIG. 4, the low power consumption oscillator comprises a capacitor C1, a current bias module 40, a switch module 50 and a comparator 60 as described above, the capacitor C1 connects to the current bias module 40 and a positive input end P of the comparator 60, the current bias module 40 connects to the switch module 50, the switch module 50 further connects to the comparator 60, when a voltage of the capacitor C1 is less than a low threshold voltage VL of the first negative input end N1 of the comparator 60, the comparator 60 outputs a low voltage to the switch module 50, which then controls the current bias module 40 to charge the capacitor C1; when the voltage of the capacitor C1 is greater than a high threshold voltage VH of the second negative input end N2 of the comparator 60, the comparator 60 outputs a high voltage to the switch module 50, which then controls the current bias module 40 to discharge the capacitor C1, the low threshold voltage is less than the high threshold voltage.

The low power consumption oscillator provided in the present invention, wherein, through arranging the capacitor C1, the current bias module 40, the switch module 50 and the comparator 60 having two negative input ends as described above, the positive input end P of the comparator 60 inputs the voltage of the capacitor C1, the first negative input end N1 inputs the low threshold voltage VL, the second negative input end N2 inputs the high threshold voltage VH, when the voltage of the capacitor C1 is less than the low threshold voltage VL, the comparator 60 outputs the low voltage to the switch module 50, which then controls the current bias module 40 to charge the capacitor C1, and the voltage of the capacitor C1 rises; when the voltage of the capacitor C1 is greater than the high threshold voltage VH, the comparator 60 outputs a high voltage to the switch module 50, which then controls the current bias module 40 to discharge the capacitor C1, and the voltage of the capacitor C1 lowers, until the voltage of the capacitor C1 is less than the low threshold voltage VL, the comparator 60 outputs the low voltage again, the switch module 50 controls the current bias module 40 to charge the capacitor C1, which is repeated again and again, thus the capacitor C1 gets a periodic charging and discharging, that makes the voltage of the capacitor C1 oscillate between the low threshold voltage VL and the high threshold voltage VH, before generating an oscillation signal, therefore, by a comparator, a normal work of the oscillator is achieved, that lowers a power consumption of the circuit.

Specifically, the current bias module 40 comprises a first current mirror unit 401 and a second current mirror unit 402, when the voltage of the capacitor C1 is less than the low threshold voltage VL, the comparator 60 outputs the low voltage to the switch module 50, which then controls the first current mirror unit 401 to charge the capacitor C1; when the voltage of the capacitor C1 is greater than the high threshold voltage VH, the comparator 60 outputs the high voltage to the switch module 50, which then controls the second current mirror unit 402 to discharge the capacitor C1, through the switch module 50 controlling the first current mirror unit 401 and the second current mirror unit 402 to charge and discharge the capacitor C1, the voltage of the capacitor C1 is oscillating between the low threshold voltage VL and the high threshold voltage VH, before generating the oscillation signal.

Further, the switch module 50 comprises a first switch unit 501 and a second switch unit 502, when the voltage of the capacitor C1 is less than the low threshold voltage VL, the comparator 60 outputs the low voltage to the switch module 50, starting up the first switch unit 501 and shutting down the second switch unit 502, making the first current mirror unit 401 charge the capacitor C1; when the voltage of the capacitor C1 is greater than the high threshold voltage VH, the comparator 60 outputs the high voltage to the switch module 50, shutting down the first switch unit 501 and starting up the second switch unit 502, making the second current mirror unit 402 discharge the capacitor C1, and the comparator 60 outputs a high/low voltage according to the comparison result, so as to control the startup or shutdown of the first switch unit 501 and the second switch unit 502, further controls the first current mirror unit 401 and the second current mirror unit 402 to charge and discharge the capacitor C1, and controlling precisely an action of charging and discharging the capacitor C1 according to the output result is achieved, thus a working liability of the oscillator is improved.

Continue referencing to FIG. 4, the first switch unit 501 comprises a second switch tube Q22, the second switch unit 502 comprises a third switch tube Q23; wherein, the second switch tube Q22 is a PMOS tube, which shuts down when the gate electrode is at the high voltage, and conducts when the gate electrode is at the low voltage; wherein, the third switch tube Q23 is an NMOS tube, which conducts when the gate electrode is at the high voltage, and shuts down when the gate electrode is at the low voltage.

A source electrode of the second switch tube Q22 connects to the first current mirror unit 401, the drain electrode of the second switch tube Q22 connects to the drain electrode of the third switch tube Q23, further connects to the positive input end of the comparator 60 and one end of the capacitor C1, the gate electrode of the second switch tube Q22 connects to the gate electrode of the third switch tube Q23 and the output end of the comparator 60, the source electrode of the third switch tube Q23 connects to the second current mirror unit 402.

The first current mirror unit 401 comprises a tenth MOS tube Q10, an eleventh MOS tube Q11, a twelfth MOS tube Q12 and a thirteenth MOS tube Q13; a source electrode of the tenth MOS tube Q10 and a source electrode of the twelfth MOS tube Q12 connect to the VCC power supplier end, a gate electrode of the tenth MOS tube Q10 connects to a gate electrode of the twelfth MOS tube Q12, a drain electrode of the tenth MOS tube Q10 and a source electrode of the eleventh MOS tube Q11, a gate electrode of the eleventh MOS tube Q11 connects to a gate electrode of the thirteenth MOS tube Q13, a drain electrode of the eleventh MOS tube Q11 and the second current mirror unit 402, a drain electrode of the twelfth MOS tube Q12 connects to a source electrode of the thirteenth MOS tube Q13, a drain electrode of the thirteenth MOS tube Q13 connects to a source electrode of the second switch tube Q22, wherein, the tenth MOS tube Q10, the eleventh MOS tube Q11, the twelfth MOS tube Q12 and the thirteenth MOS tube Q13 are all PMOS tubes, the twelfth MOS tube Q12 and the thirteenth MOS tube Q13 provide a charging current for the capacitor C1.

Further, The second current mirror unit 402 comprises a fourteenth MOS tube Q14, a fifteenth MOS tube Q15, a sixteenth MOS tube Q16, a seventeenth MOS tube Q17; an eighteenth MOS tube Q18 and a nineteenth MOS tube Q19; a drain electrode of the fourteenth MOS tube Q14 connects to a second bias terminal BIAS2, and further connects to a gate electrode of the fourteenth MOS tube Q14, the gate electrode of the fourteenth MOS tube Q14 further connects to a gate electrode of the sixteenth MOS tube Q16 and a gate electrode of the eighteenth MOS tube Q18, a source electrode of the fourteenth MOS tube Q14 connects to a drain electrode of the fifteenth MOS tube Q15 and a gate electrode of the fifteenth MOS tube Q15, the gate electrode of the fifteenth MOS tube Q15 further connects to a gate electrode of the seventeenth MOS tube Q17 and a gate electrode of the nineteenth MOS tube Q19, a drain electrode of the sixteenth MOS tube Q16 connects to a drain electrode of the eleventh MOS tube Q11, a gate electrode of the eleventh MOS tube Q11 and a gate electrode of the thirteenth MOS tube Q13, a source electrode of the sixteenth MOS tube Q16 connects to a drain electrode of the seventeenth MOS tube Q17, a drain electrode of the eighteenth MOS tube Q18 connects to a source electrode of the third switch tube Q23, a source electrode of the eighteenth MOS tube Q18 connects to a drain electrode of the nineteenth MOS tube Q19, a source electrode of the fifteenth MOS tube Q15, a source electrode of the seventeenth MOS tube Q17 and a source electrode of the nineteenth MOS tube Q19 connect to other end of the capacitor C1 and get grounded, wherein, the fourteenth MOS tube Q14, the fifteenth MOS tube Q15, the sixteenth MOS tube Q16, the seventeenth MOS tube Q17, the eighteenth MOS tube Q18 and the nineteenth MOS tube Q19 are all NMOS tubes, the eighteenth MOS tube Q18 and the nineteenth MOS tube Q19 provide a discharging current to the capacitor C1.

In order to better understand the technical protocol of the present invention, further detailed descriptions on a work process of the comparator and the low power consumption oscillator of the present invention are stated here, through specific embodiments, and referencing to attached drawings 2 and 4:

The positive input end P of the comparator 60 inputs the voltage of the capacitor C1, the first negative input end N1 inputs the low threshold voltage VL, the second negative input end N2 inputs the high threshold voltage VH.

At an initial state, the voltage of the capacitor C1 input to the positive input end P is zero, the buffering and outputting module 30 of the comparator 60 outputs the low voltage to the first switch tube Q21, now the first switch tube Q21 shuts off, the third MOS tube Q3 does not work, that is, the first negative input end N1 does not connect to the circuit, meanwhile, the comparator 60 outputs the low voltage to the switch module 50, now the second switch tube Q22 starts up, the third switch tube Q23 shuts down, the twelfth MOS tube Q12 and the thirteenth MOS tube Q13 charge the capacitor C1, and the voltage of the capacitor C1 rises.

When the voltage of the capacitor C1 rises and exceeds the high threshold voltage VH of the second negative input end N2, the buffering and outputting module 30 of the comparator 60 outputs the high voltage to the first switch tube Q21, now the first switch tube Q21 starts up, the third MOS tube Q3 connects to the circuit, that is, the first negative input end N1 connects to the circuit, meanwhile, the comparator 60 outputs the high voltage to the switch module 50, making the second switch tube Q22 shut down, the third switch tube Q23 start up, the eighteenth MOS tube Q18 and the nineteenth MOS tube Q19 discharge the capacitor C1, and the voltage of the capacitor C1 decreases, due to the low threshold voltage VL of the first negative input end N1 is less than the high threshold voltage VH of the second negative input end N2, the comparator 60 compares the voltage of the capacitor C1 of the positive input end P to the voltage VL of the first negative input end N1, the comparator will still output the high voltage, and the eighteenth MOS tube Q18 and the nineteenth MOS tube Q19 continue discharging the capacitor C1, and the voltage of the capacitor C1 keeps decreasing.

When the voltage of the capacitor C1 decreases to less than the low threshold voltage VL of the first negative input end N1, the buffering and outputting module 30 of the comparator 60 outputs again the low voltage to the first switch tube Q21, now the first switch tube Q21 shuts off, the third MOS tube Q3 does not work, that is, the first negative input end N1 does not connect to the circuit, meanwhile, the comparator 60 outputs the low voltage to the switch module 50, making the second switch tube Q22 start up and the third switch tube Q23 shut down, the twelfth MOS tube Q12 and the thirteenth MOS tube Q13 charge again the capacitor C1, and the voltage of the capacitor C1 rises, repeating in such a way, executing a periodic charging and discharging to the capacitor C1, and making the voltage of the capacitor C1 oscillate between the low threshold voltage VL and the high threshold voltage VH, and outputting the oscillation signal.

All above, the present invention provides a comparator and low power consumption oscillator thereof, wherein, the comparator comprises a current mirror module, a comparison module and a buffering and outputting module, the low power consumption oscillator comprises a capacitor, a current bias module, a switch module and the comparator, the comparison module comprises a positive input end, a first negative input end and a second negative input end, the capacitor connects to the positive input end of the comparator, when a voltage of the capacitor is less than a low threshold voltage of the first negative input end of the comparator, the comparator outputs a low voltage to the switch module, which controls the current bias module to charge the capacitor; when a voltage of the capacitor is greater than a high threshold voltage of the second negative input end of the comparator, the comparator outputs a high voltage to the switch module, which controls the current bias module to discharge the capacitor, thus, through one comparator, a periodic charging and discharging to the capacitor is achieved, and an oscillation signal is output, thus a number of the comparators is reduced, a structure of the circuit is simplified, a power consumption of the circuit and a cost of a product is reduced.

It should be understood that, the application of the present invention is not limited to the above examples listed. Ordinary technical personnel in this field can improve or change the applications according to the above descriptions, all of these improvements and transforms should belong to the scope of protection in the appended claims of the present invention.

What is claimed is:

1. A comparator comprising a current mirror module, a comparison module and a buffering and outputting module, wherein
the current mirror module provides a bias current to the comparison module,
the comparison module comprises a positive input end, a first negative input end and a second negative input end, the positive input end connects to an external terminal, the first negative input end and the second negative input end input a low threshold voltage and a high threshold voltage, respectively,
the comparison module compares a voltage of the positive input end to the low threshold voltage and the high threshold voltage, and outputs a comparison result to the buffering and outputting module,
when the voltage of the positive input end is less than the low threshold voltage, the buffering and outputting module outputs a low voltage to the comparison module;
when the voltage of the positive input end is greater than the high threshold voltage, the buffering and outputting module outputs a high voltage to the comparison module;
the comparison module comprises a first comparison unit, a second comparison unit and an amplifying unit,
the first comparison unit comprises the first negative input end,
the second comparison unit comprises the positive input end and the second negative input end, the second comparison unit outputs the comparison result to the amplifying unit, which then amplifies the comparison result before outputting to the buffering and outputting module,
when the voltage of the positive input end is less than the low threshold voltage of the first negative input end, the buffering and outputting module outputs a low voltage to the first comparison unit, and controls the first comparison unit to shut down;
when the voltage of the positive input end is larger than the high threshold voltage of the second negative input end, the buffering and outputting module outputs a high voltage to the first comparison unit, and controls the first comparison unit to start up, the low threshold voltage is less than the high threshold voltage;
the first comparison unit comprises a third MOS tube and a first switch tube, the second comparison unit comprises a fourth MOS tube, a fifth MOS tube, a sixth MOS tube, a seventh MOS tube, the amplifying unit comprises an eighth MOS tube and a ninth MOS tube;
a source electrode of the third MOS tube, a source electrode of the fourth MOS tube, and a source electrode of the sixth MOS tube connect to the drain electrode of the second MOS tube, the gate electrode of the third MOS tube is the negative input end of the comparator, the drain electrode of the third MOS tube connects to the drain electrode of the first switch tube, the gate electrode of the first switch tube connects to the buffering and outputting module, the gate electrode of the fourth MOS tube is the second negative input end of the comparator, the drain electrode of the fourth MOS tube connects to the source electrode of the first switch tube, the drain electrode of the fifth MOS tube and the gate electrode of the fifth MOS tube, the gate electrode of the fifth MOS tube connects to the gate electrode of the seventh MOS tube, the gate electrode of the sixth MOS tube is the positive input end of the comparator, the drain electrode of the sixth MOS tube connects to a gate electrode of the ninth MOS tube and a drain electrode of the seventh MOS tube, a gate electrode of the eighth MOS tube connects to the gate electrode of the second MOS tube, a source electrode of the eighth MOS tube connects to the VCC power supplier end, a drain electrode of the eighth MOS tube connects to a drain electrode of the ninth MOS tube and the buffering and outputting module, the source electrode of the fifth MOS tube, the source electrode of the seventh MOS tube and the source electrode of the ninth MOS tube get grounded.

2. The comparator according to claim 1, wherein, the current mirror module comprises a first MOS tube and a second MOS tube; a source electrode of the first MOS tube and a source electrode of the second MOS tube connect to a VCC power supplier end, a gate electrode of the first MOS tube connects to a drain electrode of the first MOS tube, a gate electrode of the second MOS tube and a first bias terminal, a drain electrode of the second MOS tube connects to the comparison module.

3. The comparator according to claim 1, wherein, the current mirror module comprises a first MOS tube and a second MOS tube; a source electrode of the first MOS tube and a source electrode of the second MOS tube connect to a VCC power supplier end, a gate electrode of the first MOS tube connects to a drain electrode of the first MOS tube, a gate electrode of the second MOS tube and a first bias terminal, a drain electrode of the second MOS tube connects to the comparison module.

4. A low power consumption oscillator comprising a capacitor and a current bias module, wherein,
the low power consumption oscillator further comprises a switch module and the comparator,
the comparator comprises a current mirror module, a comparison module and a buffering and outputting module, the current mirror module provides a bias current to the comparison module,
the comparison module comprises a positive input end, a first negative input end and a second negative input end, the positive input end connects to an external terminal, the first negative input end and the second negative input end input a low threshold voltage and a high threshold voltage, respectively, the comparison module compares a voltage of the positive input end to the low threshold voltage and the high threshold voltage, and outputs a comparison result to the buffering and outputting module, when the voltage of the positive input end is less than the low threshold voltage, the buffering and outputting module outputs a low voltage to the comparison module;

when the voltage of the positive input end is greater than the high threshold voltage, the buffering and outputting module outputs a high voltage to the comparison module;

the capacitor connects to a positive input end of the comparator, when a voltage of the capacitor is less than the low threshold voltage of the first negative input end of the comparator, the comparator outputs the low voltage to the switch module, which then controls the current bias module to charge the capacitor;

when the voltage of the capacitor is greater than the high threshold voltage of the second negative input end of the comparator, the comparator outputs the high voltage to the switch module, which controls the current bias module to discharge the capacitor, the low threshold voltage is less than the high threshold voltage;

the current bias module comprises a first current mirror unit and a second current mirror unit, when the voltage of the capacitor is less than the low threshold voltage, the comparator outputs a low voltage to the switch module, which then controls the first current mirror unit to charge the capacitor; when the voltage of the capacitor is greater than the high threshold voltage, the comparator outputs the high voltage to the switch module, which controls the second current mirror unit to discharge the capacitor;

the switch module comprises a first switch unit and a second switch unit, when the voltage of the capacitor is less than the low threshold voltage, the comparator outputs the low voltage to the switch module, starting up the first switch unit and shutting down the second switch unit, making the first current mirror unit charge the capacitor; when the voltage of the capacitor is greater than the high threshold voltage, the comparator outputs the high voltage to the switch module, shutting down the first switch unit and starting up the second switch unit, making the second current mirror unit discharge the capacitor;

the first switch unit comprises a second switch tube, the second switch unit comprises a third switch tube; a source electrode of the second switch tube connects to the first current mirror unit, the drain electrode of the second switch tube connects to the drain electrode of the third switch tube, further connects to the positive input end of the comparator and one end of the capacitor, the gate electrode of the second switch tube connects to the gate electrode of the third switch tube and the output end of the comparator, the source electrode of the third switch tube connects to the second current mirror unit;

the first current mirror unit comprises a tenth MOS tube, an eleventh MOS tube, a twelfth MOS tube and a thirteenth MOS tube; a source electrode of the tenth MOS tube and a source electrode of the twelfth MOS tube connect to the VCC power supplier end, a gate electrode of the tenth MOS tube connects to a gate electrode of the twelfth MOS tube, a drain electrode of the tenth MOS tube and a source electrode of the eleventh MOS tube, a gate electrode of the eleventh MOS tube connects to a gate electrode of the thirteenth MOS tube, a drain electrode of the eleventh MOS tube and the second current mirror unit, a drain electrode of the twelfth MOS tube connects to a source electrode of the thirteenth MOS tube, a drain electrode of the thirteenth MOS tube connects to a source electrode of the second switch tube.

5. The low power consumption oscillator according to claim 4, wherein, the second current mirror unit comprises a fourteenth MOS tube, a fifteenth MOS tube, a sixteenth MOS tube, a seventeenth MOS tube; an eighteenth MOS tube and a nineteenth MOS tube; a drain electrode of the fourteenth MOS tube connects to a second bias terminal, and further connects to a gate electrode of the fourteenth MOS tube, the gate electrode of the fourteenth MOS tube further connects to a gate electrode of the sixteenth MOS tube and a gate electrode of the eighteenth MOS tube, a source electrode of the fourteenth MOS tube connects to a drain electrode of the fifteenth MOS tube and a gate electrode of the fifteenth MOS tube, the gate electrode of the fifteenth MOS tube further connects to a gate electrode of the seventeenth MOS tube and a gate electrode of the nineteenth MOS tube, a drain electrode of the sixteenth MOS tube connects to a drain electrode of the eleventh MOS tube, a gate electrode of the eleventh MOS tube and a gate electrode of the thirteenth MOS tube, a source electrode of the sixteenth MOS tube connects to a drain electrode of the seventeenth MOS tube, a drain electrode of the eighteenth MOS tube connects to a source electrode of the third switch tube, a source electrode of the eighteenth MOS tube connects to a drain electrode of the nineteenth MOS tube, a source electrode of the fifteenth MOS tube, a source electrode of the seventeenth MOS tube and a source electrode of the nineteenth MOS tube connect to other end of the capacitor and get grounded.

* * * * *